United States Patent
Chen et al.

(10) Patent No.: US 10,606,167 B2
(45) Date of Patent: *Mar. 31, 2020

(54) PHOTOLITHOGRAPHY MASK PLATE

(71) Applicants: Tsinghua University, Beijing (CN); HON HAI PRECISION INDUSTRY CO., LTD., New Taipei (TW)

(72) Inventors: Mo Chen, Beijing (CN); Qun-Qing Li, Beijing (CN); Li-Hui Zhang, Beijing (CN); Yuan-Hao Jin, Beijing (CN); Dong An, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 76 days.

This patent is subject to a terminal disclaimer.

(21) Appl. No.: 15/684,428

(22) Filed: Aug. 23, 2017

(65) Prior Publication Data
US 2018/0158690 A1    Jun. 7, 2018

(30) Foreign Application Priority Data
Dec. 1, 2016    (CN) .......................... 2016 1 1093541

(51) Int. Cl.
*G03F 1/50*    (2012.01)
*H01L 21/308*    (2006.01)
*H01L 21/027*    (2006.01)
*H01L 51/00*    (2006.01)
*G03F 1/54*    (2012.01)

(52) U.S. Cl.
CPC .................. *G03F 1/50* (2013.01); *G03F 1/54* (2013.01); *H01L 21/0276* (2013.01); *H01L 21/3081* (2013.01); *H01L 21/3086* (2013.01); *H01L 51/0018* (2013.01)

(58) Field of Classification Search
CPC ........................................ G03F 1/48
See application file for complete search history.

(56) References Cited

U.S. PATENT DOCUMENTS

| | | | |
|---|---|---|---|
| 6,811,957 B1 | 11/2004 | Mau et al. | |
| 8,845,912 B2 | 9/2014 | Slafer | |
| 2006/0284162 A1 | 12/2006 | Kurt et al. | |
| 2016/0139511 A1* | 5/2016 | Li ..................... | H01J 37/32009 216/48 |

FOREIGN PATENT DOCUMENTS

JP    2007-504504 A    3/2007

* cited by examiner

*Primary Examiner* — Kathleen Duda
(74) *Attorney, Agent, or Firm* — ScienBiziP, P.C.

(57) ABSTRACT

A photolithography mask plate, the photolithography mask plate including: a substrate; a carbon nanotube composite structure on a surface of the substrate, wherein the carbon nanotube composite structure comprises a carbon nanotube layer and a chrome layer coated on the carbon nanotube layer; a cover layer on the carbon nanotube composite structure.

13 Claims, 20 Drawing Sheets

PHOTOLITHOGRAPHY MASK PLATE

CROSS-REFERENCE TO RELATED APPLICATIONS

This application claims all benefits accruing under 35 U.S.C. § 119 from China Patent Application No. 201611093541.9, filed on Dec. 1, 2016, in the China Intellectual Property Office, the disclosure of which is incorporated herein by reference.

FIELD

The subject matter herein generally relates to a photolithography mask plate.

BACKGROUND

At present, with in depth studies on microstructures, microstructures can be applied to multiple fields, such as special surfaces of optical devices, hydrophobic material, anti-reflection surfaces. For example, a microstructure is generally provided in a light guide plate in order to improve the light emission efficiency in the optical devices. The main methods for making the microstructures are photolithography, etching and so on. Photolithography is widely used because of the simple process, easy operation and preparation in a large area. However, the mask material in photolithography are generally plastic, glass or pattern metal. The microstructures obtained by these mask material have low dimensional accuracy. Also it is difficult to obtain microstructures in nanoscale.

What is needed, therefore, is to provide a photolithography mask plate for solving the problem discussed above.

BRIEF DESCRIPTION OF THE DRAWINGS

Many aspects of the exemplary embodiments can be better understood with references to the following drawings. The components in the drawings are not necessarily drawn to scale, the emphasis instead being placed upon clearly illustrating the principles of the exemplary embodiments. Moreover, in the drawings, like reference numerals designate corresponding parts throughout the several views. Implementations of the present technology will now be described, by way of example only, with reference to the attached figures, wherein.

DETAILED DESCRIPTION

Figure 1:
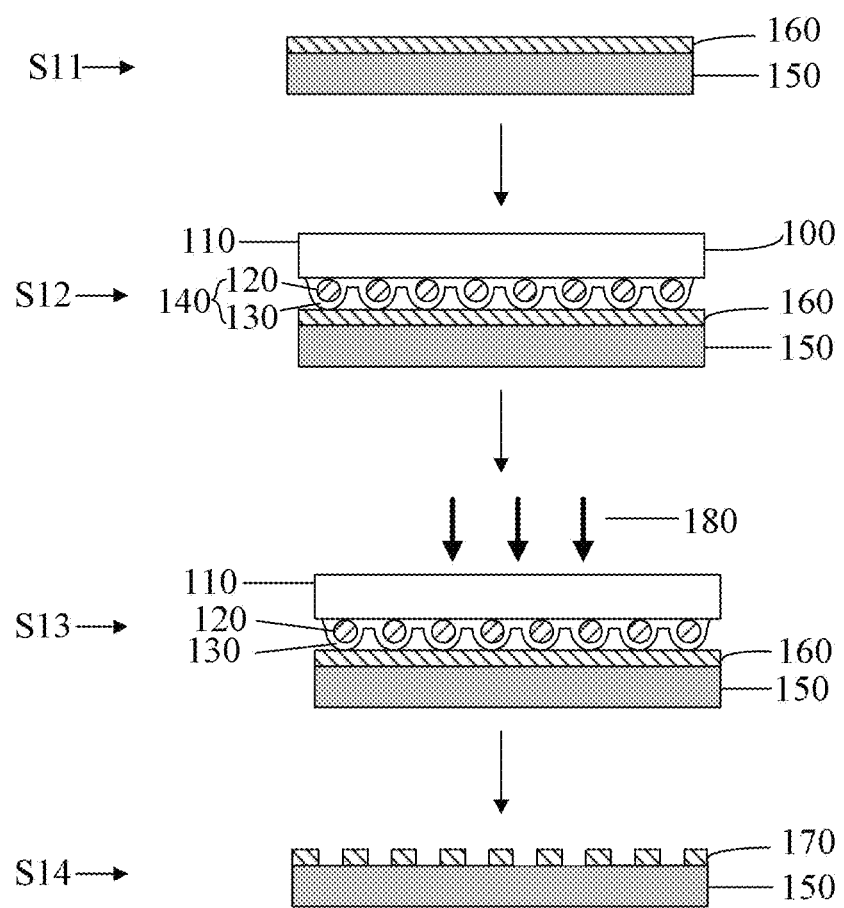
FIG. 1 is a flow chart of one exemplary embodiment of a method of making microstructure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale, and the proportions of certain parts may be exaggerated to better illustrate details and features. The description is not to be considered as limiting the scope of the exemplary embodiments described herein.

Several definitions that apply throughout this disclosure will now be presented.

The connection can be such that the objects are permanently connected or releasably connected. The term "substantially" is defined to be essentially conforming to the particular dimension, shape or other word that substantially modifies, such that the component need not be exact. The term "comprising" means "including, but not necessarily limited to"; it specifically indicates open-ended inclusion or membership in a so-described combination, group, series and the like. It should be noted that references to "an" or "one" exemplary embodiment in this disclosure are not necessarily to the same exemplary embodiment, and such references mean at least one.

Referring to FIG. 1, an exemplary embodiment of a method of making microstructures comprises:

S11, providing a first substrate 150, setting a photoresist layer 160 on a surface of the first substrate 150;

S12, covering a surface of the photoresist layer 160 with a photolithography mask plate 100, wherein the photolithography mask plate 100 includes a second substrate 110 and a composite layer 140 located on a surface of the second substrate 110; S13, exposing the photoresist layer 160 by irradiating the photoresist layer 160 through the photolithography mask plate 100 with ultraviolet light 180, wherein the ultraviolet light 180 reach the photoresist layer 160 through the second substrate 110 and the composite layer 140;

S14, removing the photolithography mask plate 100 from the photoresist layer 160, and developing the photoresist layer 160 to obtain a patterned photoresist microstructures 170.

In step S11, the first substrate 150 can be insulating materials such as silica or silicon nitride. The first substrate 150 can also be conductive materials such as gold, aluminum, nickel, chromium, or copper. Also the first substrate 150 can be semiconductor materials such as silicon, gallium nitride, or gallium arsenide. In one exemplary embodiment, the first substrate 150 is a silicon wafer.

The type of the photoresist layer 160 can be negative or positive. The photoresist layer 160 can be S9912 positive photoresist or SU8 negative photoresist. The photoresist layer 160 can be directly applied to the surface of the first substrate 150 by spin coating. The thickness of the photoresist layer 160 can be in a range of about 50 nm to about 200 nm. When the thickness of the photoresist layer 160 is too thin, graphic contrast after photolithography decreases. When the thickness of the photoresist layer 160 is too thick, patterned photoresist can easily create slopes near the edge of the pattern. In one exemplary embodiment, the photoresist layer 160 is S9912 positive photoresist, and the thickness of the photoresist layer 160 is about 100 nm.

In step S12, the photolithography mask plate 100 provides a patterned mask. The photolithography mask plate 100 includes at least a second substrate 110 and a composite layer 140 located on the surface of the second substrate 110. The composite layer 140 includes a carbon nanotube layer 120 and a cover layer 130. The carbon nanotube layer 120 is directly located on the surface of the second substrate 110. The cover layer 130 covers the carbon nanotube layer 120 so that the carbon nanotube layer 120 is sandwiched between the cover layer 130 and second substrate 110. The cover layer 130 is continuously and directly attached to a surface of the carbon nanotube layer 120. The cover layer 130 is bonded to the carbon nanotube layer 120 to form the composite layer 140. Due to portions of the cover layer 130 can extend through the holes of the carbon nanotube layer 120 to be in direct contact with the second substrate 110, the cover layer 130 can fix the carbon nanotube layer 120 on the second substrate 110.

The photolithography mask plate 100 covers the photoresist layer 160. The photolithography mask plate 100 is located on the surface of the photoresist layer 160 away from the first substrate 150. In one exemplary embodiment, the composite layer 140 is in direct contact with the surface of the photoresist layer 160 away from the first substrate 150. The second substrate 110 is spaced from the photoresist layer 160. In one exemplary embodiment, the second substrate 110 can be in direct contact with the photoresist layer 160 so that the second substrate 110 sandwiched between the composite layer 140 and the photoresist layer 160. The composite layer 140 is spaced from the photoresist layer 160. When the composite layer 140 is located on the surface of the photoresist layer 160, the composite layer 140 is not completely in direct contact with the surface of the photoresist layer 160, and there may be air gaps between partial surfaces of the composite layer 140 and surfaces of the photoresist layer 160.

The second substrate 110 serves as a support. Materials of the second substrate 110 can be rigid materials (e.g., p-type or n-type silicon, quartz, silicon with a silicon dioxide layer formed thereon, crystal, crystal with an oxide layer formed thereon), or flexible materials (e.g., plastic or resin). The second substrate 110 material can be polyethylene terephthalate, polyethylene naphthalate two formic acid glycol ester (PEN), or polyimide. The second substrate 110 has a high transmittance to UV light, for example more than 60%. In one exemplary embodiment, the second substrate 110 material is quartz.

The carbon nanotube layer 120 includes a plurality of carbon nanotubes parallel to the surface of the carbon nanotube layer 120. The plurality of carbon nanotubes along an extending direction joined end to end by van der Waals attraction forces. The carbon nanotube layer 120 is a free-standing structure. The term "free-standing structure" includes the carbon nanotube layer 120 that can sustain the weight of itself when it is hoisted by a portion thereof without any significant damage to its structural integrity. Thus, the carbon nanotube layer 120 can be suspended by two spaced supports (not shown). The plurality of carbon nanotubes can be single-walled carbon nanotubes, double-walled carbon nanotubes, or multi-walled carbon nanotubes. The length and diameter of the plurality of carbon nanotubes can be selected according to need. The diameter of the single-walled carbon nanotubes can be from about 0.5 nanometers to about 10 nanometers. The diameter of the double-walled carbon nanotubes can be from about 1.0 nanometer to about 15 nanometers. The diameter of the multi-walled carbon nanotubes can be from about 1.5 nanometers to about 50 nanometers. In one exemplary embodiment, the length of the carbon nanotubes can be from about 200 micrometers to about 900 micrometers.

The carbon nanotube layer 120 can include at least one carbon nanotube film, at least one carbon nanotube wire, or combination thereof. In one exemplary embodiment, the carbon nanotube layer 120 can be pure carbon nanotube layer. In one exemplary embodiment, the carbon nanotube layer 120 can include a single carbon nanotube film or two or more carbon nanotube films stacked together. Thus, the thickness of the carbon nanotube layer 120 can be controlled by the number of the stacked carbon nanotube films. In one exemplary embodiment, the carbon nanotube layer 120 is formed by folding a single carbon nanotube wire. In one exemplary embodiment, the carbon nanotube layer 120 can include a layer of parallel and spaced carbon nanotube wires. Also, the carbon nanotube layer 120 can include a plurality of carbon nanotube wires crossed or weaved together to form a carbon nanotube net. The carbon nanotube net defines a plurality of holes. The plurality of holes extend throughout the carbon nanotube layer 120 along the thickness direction of the layer. It is understood that any carbon nanotube structure described can be used with all exemplary embodiments.

Figure 2:
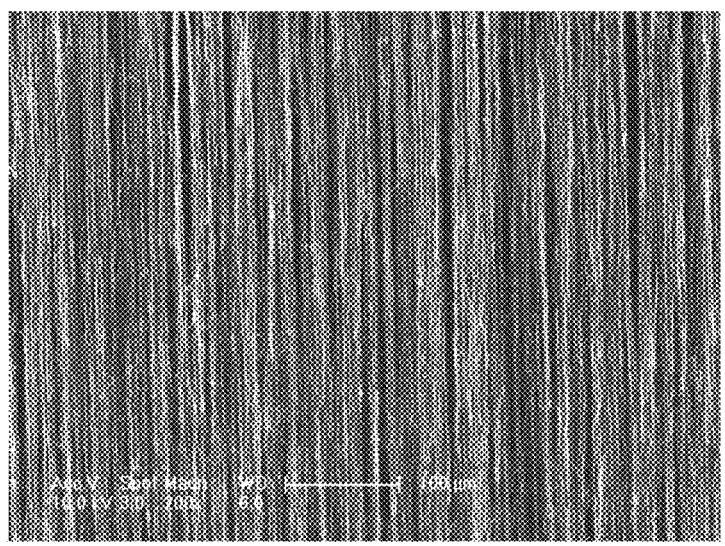
FIG. 2 is a Scanning Electron Microscope (SEM) image of the drawn carbon nanotube film.

Referring to FIG. 2, in one exemplary embodiment, the carbon nanotube layer 120 includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attraction forces therebetween. The drawn carbon nanotube film is a free-standing film. Each drawn carbon nanotube film includes a plurality of successively oriented carbon nanotube segments joined end-to-end by van der Waals attraction forces therebetween. Each carbon nanotube segment includes a plurality of carbon nanotubes parallel to each other, and combined by van der Waals attraction forces therebetween. As can be seen in FIG. 2, some variations can occur in the drawn carbon nanotube film. The carbon nanotubes in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nanometers to about 100 micrometers. The drawn carbon nanotube film defines a plurality of holes between adjacent carbon nanotubes.

Figure 3:
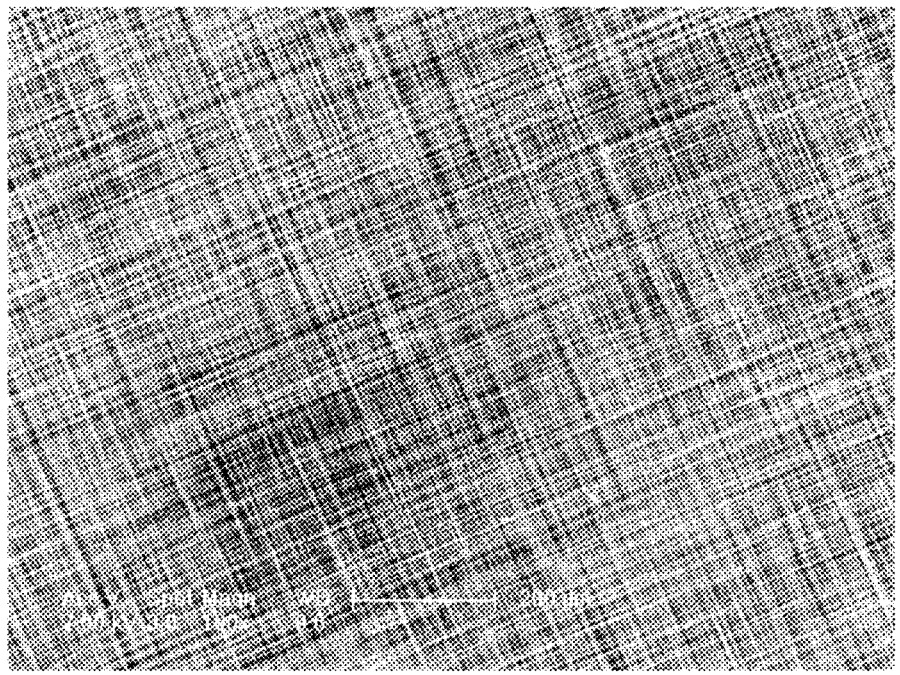
FIG. 3 is a Scanning Electron Microscope (SEM) image of a carbon nanotube structure consisting of a plurality of stacked drawn carbon nanotube precursor films.

Referring to FIG. 3, the carbon nanotube layer 120 can include at least two stacked drawn carbon nanotube films. In other exemplary embodiments, the carbon nanotube layer 120 can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attraction forces therebetween. As can be seen in FIG. 3, an angle between the aligned directions of the carbon nanotubes in two adjacent carbon nanotube films can range from about 0 degrees to about 90 degrees. When the angle between the aligned directions of the carbon nanotubes in adjacent stacked drawn carbon nanotube films is larger than 0 degrees, a plurality of holes is defined by the carbon nanotube layer 120. In one exemplary embodiment, the carbon nanotube layer 120 is shown with the aligned directions of the carbon nanotubes between adjacent stacked drawn carbon nanotube films at 90 degrees. Stacking the carbon nanotube films will also add to the structural integrity of the carbon nanotube layer 120.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During soaking, adjacent parallel carbon nanotubes in the drawn carbon nanotube film will bundle together, due to the surface tension of the organic solvent as it volatilizes, and thus, the drawn carbon nanotube film will be shrunk into an untwisted carbon nanotube wire. The untwisted carbon nanotube wire includes a plurality of carbon nanotubes substantially oriented along a same direction (i.e., a direction along the length of the untwisted carbon nanotube wire). The carbon nanotubes are substantially parallel to the axis of the untwisted carbon nanotube wire. More specifically, the untwisted carbon nanotube wire includes a plurality of successive carbon nanotube segments joined end to end by van der Waals attraction forces therebetween. Each carbon nanotube segment includes a plurality of carbon nanotubes substantially parallel to each other, and combined by van der Waals attraction forces therebetween. The carbon nanotube segments can vary in width, thickness, uniformity, and shape. The length of the untwisted carbon nanotube wire can be arbitrarily set as desired. A diameter of the untwisted carbon nanotube wire ranges from about 0.5 nanometers to about 100 micrometers.

The twisted carbon nanotube wire can be formed by twisting a drawn carbon nanotube film using a mechanical force at two opposite ends of the drawn carbon nanotube film in opposite directions. The twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attraction forces therebetween. Each carbon nanotube segment includes a plurality of carbon nanotubes parallel to each other, and combined by van der Waals attraction forces therebetween. The length of the carbon nanotube wire can be set as desired. A diameter of the twisted carbon nanotube wire can be from about 0.5 nanometers to about 100 micrometers. Further, the twisted carbon nanotube wire can be treated with a volatile organic solvent after being twisted to bundle the adjacent paralleled carbon nanotubes together. The specific surface area of the twisted carbon nanotube wire decreases while the density and strength of the twisted carbon nanotube wire increases.

The carbon nanotube layer 120 can be located directly on the surface of the second substrate 110. As carbon nanotube layer 120 defines a plurality of holes, a partial surface of the second substrate 110 is exposed through the plurality of holes.

Figure 4:
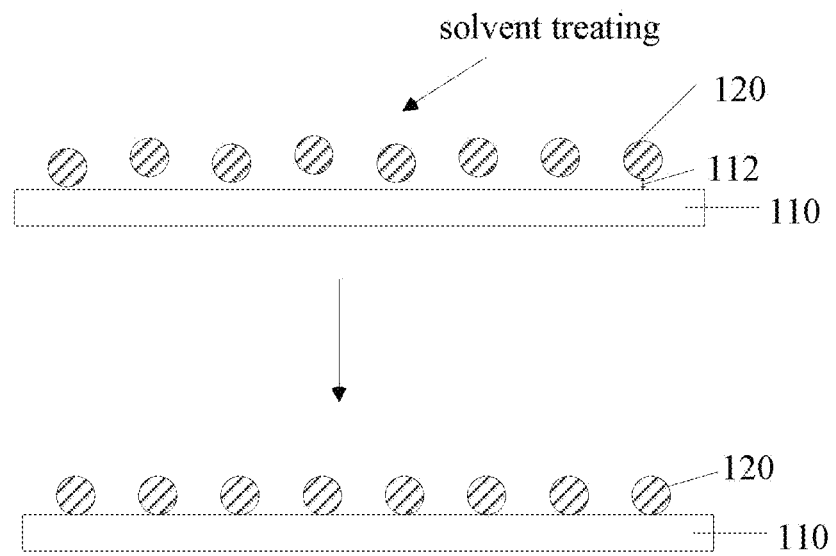
FIG. 4 is a flow chart of a method of disposing the carbon nanotube layer on the second substrate.

Furthermore, referring to FIG. 4, disposing the carbon nanotube layer 120 on the second substrate 110 comprises solvent treating the second substrate 110 with the carbon nanotube layer 120 thereon. Because there is an air gap 112 between the carbon nanotube layer 120 and the surface of the second substrate 110, the solvent can exhaust air while allowing the carbon nanotube layer 120 to be closely and firmly adhered on the surface of the second substrate 110. The solvent can be water or volatile organic solvent such as ethanol, methanol, acetone, dichloroethane, chloroform, or mixtures thereof. In one exemplary embodiment, the organic solvent is ethanol.

The material of the cover layer 130 can be metal, metal oxide, metal nitride, metal carbide, metal sulfide, silicon oxide, silicon nitride, or silicon carbide. The metal can be gold, nickel, titanium, iron, aluminum, chromium, or alloy thereof. The metal oxide can be alumina, magnesium oxide, zinc oxide, or hafnium oxide. The material of the cover layer 130 is not limited above and can be any material as long as the material can be deposited on the carbon nanotube layer 120 and have a high transmittance to UV light, for example more than 60%.

The cover layer 130 can be deposited on the surface of the carbon nanotube layer 120 by atomic layer deposition (ALD). The method of depositing the cover layer 130 can also be physical vapor deposition (PVD), chemical vapor deposition (CVD), magnetron sputtering, or spaying. The method of depositing the cover layer 130 is not limited above and can be any method as long as the cover layer 130 can be continuously deposited on the carbon nanotube layer 120 surface and the structure of the carbon nanotube layer 120 is not destroyed. The thickness of the cover layer 130 is 5 nm-20 nm. If the thickness of the cover layer 130 is more than 20 nm, the transmittance to UV light of the cover layer 130 would be seriously reduced. In one exemplary embodiment, the material of the cover layer 130 is alumina, and the thickness of the cover layer 130 is 5 nm.

Furthermore, when the carbon nanotube layer 120 is a free-standing structure, the composite layer 140 is also free-standing and can be used alone as a lithographic pattern and the second substrate 110 is not optional.

In step S13, when the ultraviolet light 180 irradiates on the photolithography mask plate 100, due to the second substrate 110 and the cover layer 130 having high transmittance, the loss of the ultraviolet light 180 is negligible as the light 180 passes through the second substrate 110 and the cover layer 130. As the carbon nanotubes is capable of strongly absorbing the ultraviolet light, the ultraviolet light irradiated on the carbon nanotube structure is almost completely absorbed and the ultraviolet light irradiated at the holes between carbon nanotubes can pass directly through the carbon nanotube layer 120. The photoresist layer 160 is exposed by irradiating the surface of the photoresist layer 160 through the photolithography mask plate 100 with the ultraviolet light 180. The surface of the photoresist layer 160 corresponding to the holes between the carbon nanotubes is exposed to the ultraviolet light 180. The surface of the photoresist layer 160 corresponding to the carbon nanotube structure is not exposed to the ultraviolet light 180. The exposure time of the photoresist layer 160 is about 2 s-7 s. In one exemplary embodiment, the exposure time of the photoresist layer 160 is about 2 s.

In step S14, the photoresist layer 160 physically contacts the photolithography mask plate 100, and the bonding force between the photoresist layer 160 and the composite layer 140 is less than the bonding force between the composite layer 140 and the second substrate 110. Thus, the photolithography mask plate 100 can be separated from the photoresist layer 160 by applying a force to the second substrate 110, and the structure of the photolithography mask plate 100 would not be strongly affected. After the photolithography mask plate 100 is separated from the surface of the photoresist layer 160, the structure of the photolithography mask plate 100 remains intact. So the photolithography mask plate 100 can be reused as a mask, and can be used repeatedly in steps S12-S13.

Figure 5:
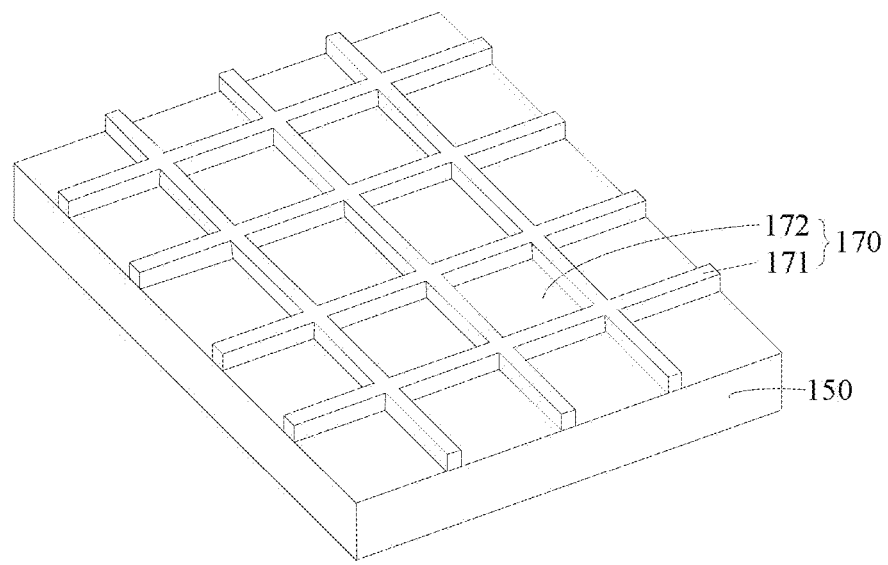
FIG. 5 is a structural schematic view of a patterned photoresist microstructure.
Figure 6:
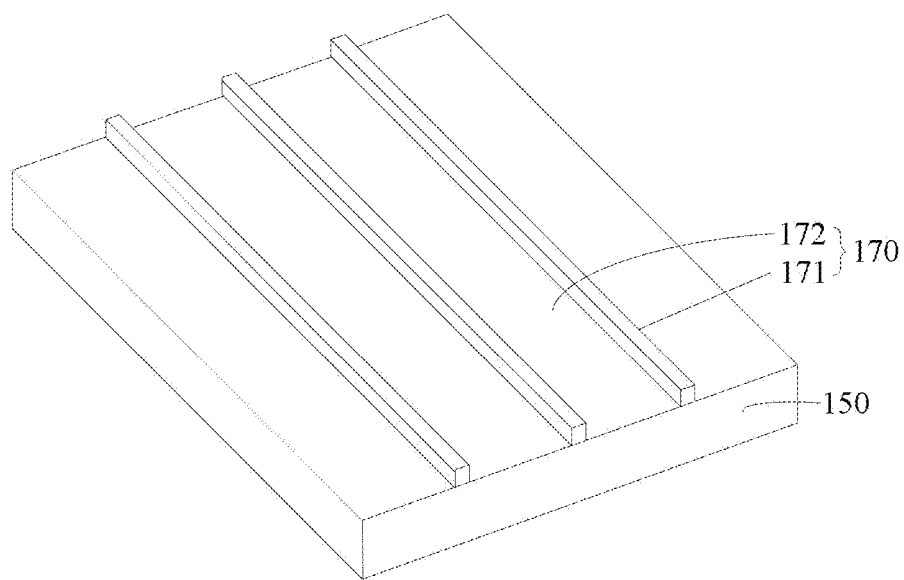
FIG. 6 is a structural schematic view of a patterned photoresist microstructure.

The photoresist layer 160 is subjected to a developing process by placing the photoresist layer 160 in a developer for a period of time. The developer is a solution containing 0.4% NaOH and 1% NaCl solution. The developing time of the photoresist layer 160 is about 20 s. The developing time can be determined by the developer composition, the concentration, and the like. The developer is not limited to above and can be any solution as long as the photoresist layer 160 can be developed. The developer can be a mixed solution of NaOH solution and NaCl solution. The mass content of NaOH in the mixed solution is about 0.2%-1%, and the mass content of NaCl is about 0.5%-2%. The patterned photoresist microstructures 170 are obtained after developing the photoresist layer 160. The pattern of the patterned photoresist microstructures 170 is consistent with the pattern of the carbon nanotube layer 120. As can be seen in FIG. 5 and FIG. 6, the patterned photoresist microstructures 170 include a plurality of ribs 171 and a plurality of micropores 172 between adjacent ribs 171, and the micropores 172 are holes or gaps. The width of the ribs 171 and the diameter of the micropores 172 are related to the diameter of the carbon nanotubes and the diameter of the holes in the carbon nanotube layer 120. The size of the micropore is the diameter of the hole or width of the gap. The plurality of micropores 172 extend throughout the patterned photoresist microstructures 170 along the thickness direction. The thickness of the ribs 171 and the depths of the micropores 172 is consistent with the thickness of the photoresist layer 160. The width of each ribs 171 is about 20 nm-200 nm, and the diameter of each microspore is about 20 nm-300 nm.

Figure 7:
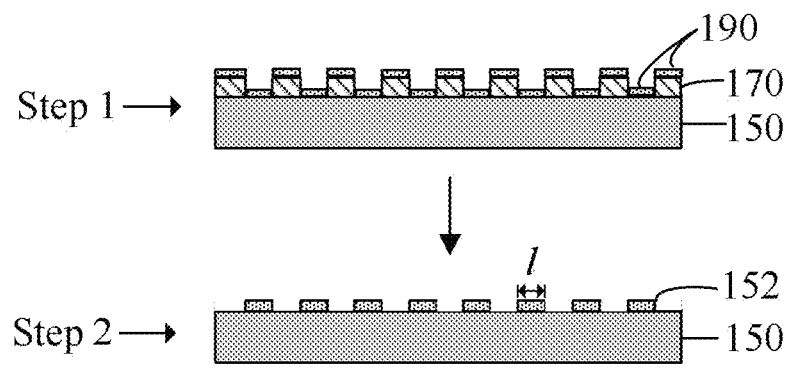
FIG. 7 is a flow chart of a lift-off method of making micro-nanostructure.

Referring to FIG. 7, microstructures 152 formed by other non-photoresist materials can be further obtained according to the patterned photoresist microstructures 170. The microstructures 152 can be made by a lift-off method, etching, or a combination thereof The method for making the microstructures 152 is not limit the aforementioned methods and can be any method as long as the microstructures 152 can be obtained. In one exemplary embodiment, the microstructures 152 are made by the lift-off method.

The lift-off method of making the microstructures 152 includes following steps: step 1, depositing a preformed layer 190 on a surface of the patterned photoresist microstructures 170 away from the first substrate 150 and an exposed surface of the first substrate 150; step 2, immersing the whole structure above in acetone, and removing the patterned photoresist microstructures 170 to obtain the microstructures 152 on the first substrate 150.

In step 1, the preformed layer 190 material can be metal, insulating materials, or semiconductor materials. The metal can be gold, silver, nickel, titanium, iron, aluminum, chromium, or alloy thereof. The insulating materials can be silicon oxide, silicon nitride. The semiconductor materials can be silicon, gallium nitride, gallium arsenide. The material of the preformed layer 190 is not limit above and can be any material as long as the material does not react with acetone. The preformed layer 190 can be deposited by magnetron sputtering, vapor deposition, CVD method, or the like. The preformed layer 190 on the patterned photoresist microstructures 170 is not continuous so that both lateral sides of the patterned photoresist microstructures 170 are not completely covered by the preformed layer 190. Thus, the acetone can be contact and react with the patterned photoresist microstructures 170. In one exemplary embodiment, the preformed layer 190 material is aluminum, and the preformed layer 190 is made by vapor deposition method.

In step 2, as both lateral sides of the patterned photoresist microstructures 170 are not completely covered by the preformed layer 190, the acetone can react with the photoresist to remove the patterned photoresist microstructures 170. At the same time, portions of the preformed layer 190 that are deposited on the patterned photoresist microstructures 170 surface can also be removed. The other portions of the preformed layer 190 that are deposited on the first substrate 150 forms the microstructures 152. In one exemplary embodiment, the carbon nanotube layer 120 includes two crossed drawn carbon nanotube films, and the microstructures 152 is a vertical crossed strips structure. The width of each strip in the direction perpendicular to the extension direction is set to be l, and the size of l is about 20 nm-200 nm, the width of spacing between two adjacent strips is about 20 nm-300 nm. The thickness of the microstructures 152 can be determined in accordance with the thickness of the preformed layer 190.

The microstructures 152 can also be formed by dry etching. The exposed surface of the first substrate 150 is etched with the patterned photoresist microstructures 170 as a mask. The dry etching can be plasma etching or reactive ion etching (RIE). In one exemplary embodiment, the dry etching is performed by applying plasma energy on the entire or partial surface of the first substrate 150 surface via a plasma device. The plasma gas can be an inert gas and/or etching gases, such as argon (Ar), helium (He), chlorine ($Cl_2$), hydrogen ($H_2$), oxygen ($O_2$), fluorocarbon ($CF_4$), ammonia ($NH_3$), or air.

When etching the first substrate 150, the etching gas can react with the first substrate 150 and may not react with the patterned photoresist microstructures 170. The reaction rate between the etching gas and the patterned photoresist microstructures 170 is much less than the reaction rate between the etching gas and the first substrate 150. The pattern of the microstructures 152 is substantially identical to the pattern of the patterned photoresist microstructures 170.

Furthermore, method of making the microstructures 152 comprises removing the patterned photoresist microstructures 170. The method of removing the patterned photoresist microstructures 170 can be ultrasonic method, tearing method, oxidation method and so on. In one exemplary embodiment, the patterned photoresist microstructures 170 are removed by ultrasonic method.

Figure 8:
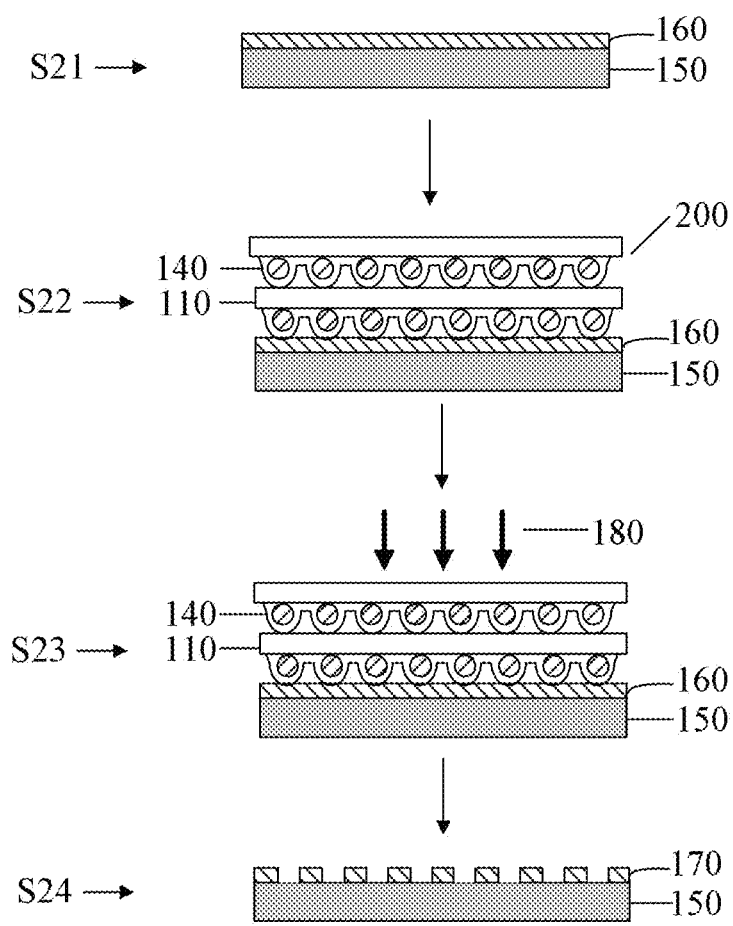
FIG. 8 is a flow chart of one exemplary embodiment of a method of making micro-nanostructure.

Referring to FIG. 8, an exemplary embodiment of a method of making microstructures comprises:

S21, providing a first substrate 150, setting a photoresist layer 160 on a surface of the first substrate 150;

S22, covering a surface of the photoresist layer 160 with a photolithography mask plate 200, wherein the photolithography mask plate 200 includes at least two second substrates 110 and at least two composite layers 140, each composite layer 140 is located on one second substrate 110 to form a photolithography mask plate unit;

S23, exposing the photoresist layer 160 by irradiating the photoresist layer 160 through the photolithography mask plate 200 with the ultraviolet light 180, wherein the ultraviolet light 180 reach the photoresist layer 160 through the second substrate 110 and the composite layer 140;

S24, removing the photolithography mask plate 200 from the photoresist layer 160, and developing the photoresist layer 160 to obtain a patterned photoresist microstructures 170.

The method of making microstructures is similar to the above method of making microstructures of FIG. 1 except that the photolithography mask plate 200 includes a plurality of second substrates and a plurality of composite layers 140. Each second substrate and each composite layer 140 locating on the second substrate 110 can be treated as a photolithography mask plate unit. The photolithography mask plate 200 includes a plurality of photolithography mask plate units. The plurality of photolithography mask plate units are stacked, and the carbon nanotubes in the photolithography mask plate unit can be arranged in parallel in one direction, or intersected in a plurality of directions.

Figure 9:
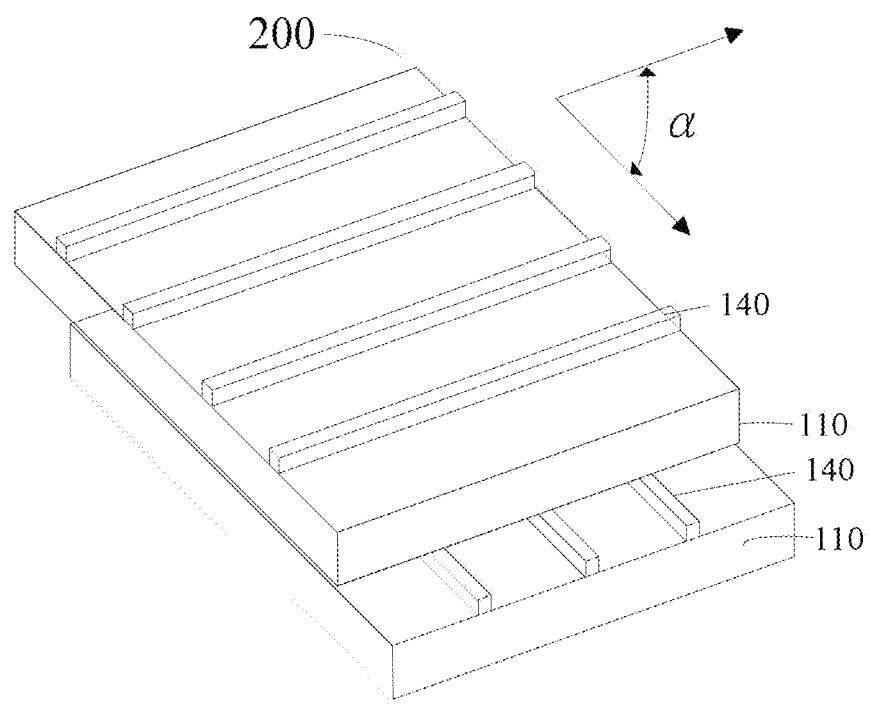
FIG. 9 is a structural schematic view of a photolithography mask plate.
Figure 10:
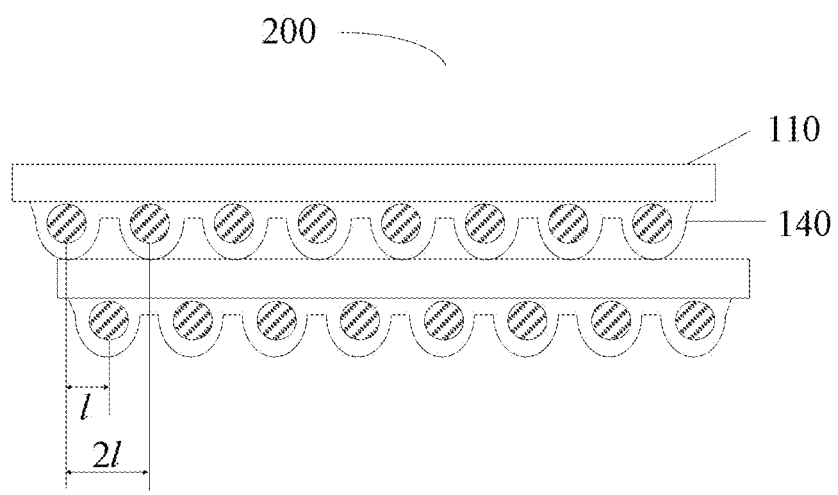
FIG. 10 is a structural schematic view of a photolithography mask plate.

The mask pattern of the photolithography mask plate 200 can be adjusted by selecting photolithography mask plate units having different arrangements of carbon nanotubes. If the mask pattern of the photolithography mask plate 200 is a network pattern, the mask pattern can be obtained by directly selecting a photolithography mask unit having intersected carbon nanotubes. Also the mask pattern can be obtained by selecting two photolithography mask units having parallel carbon nanotubes, and the two photolithography mask units are stacked and the carbon nanotubes in the two units are arranged in different directions. As can be seen in FIG. 9, the angle α of the two units can be selected as desired. As can be seen in FIG. 10, if the mask pattern of the photolithography mask plate 200 includes a plurality of parallel strips and an interval distance of each adjacent strips is l, the mask pattern can be obtained by selecting two photolithography mask units having parallel strips and the interval distance of each adjacent strips is 2 l, wherein the two photolithography mask units are stacked and the strips in the two photolithography mask units are in the same direction, and the strips of the two photolithography mask units alternates in positions.

Figure 11:
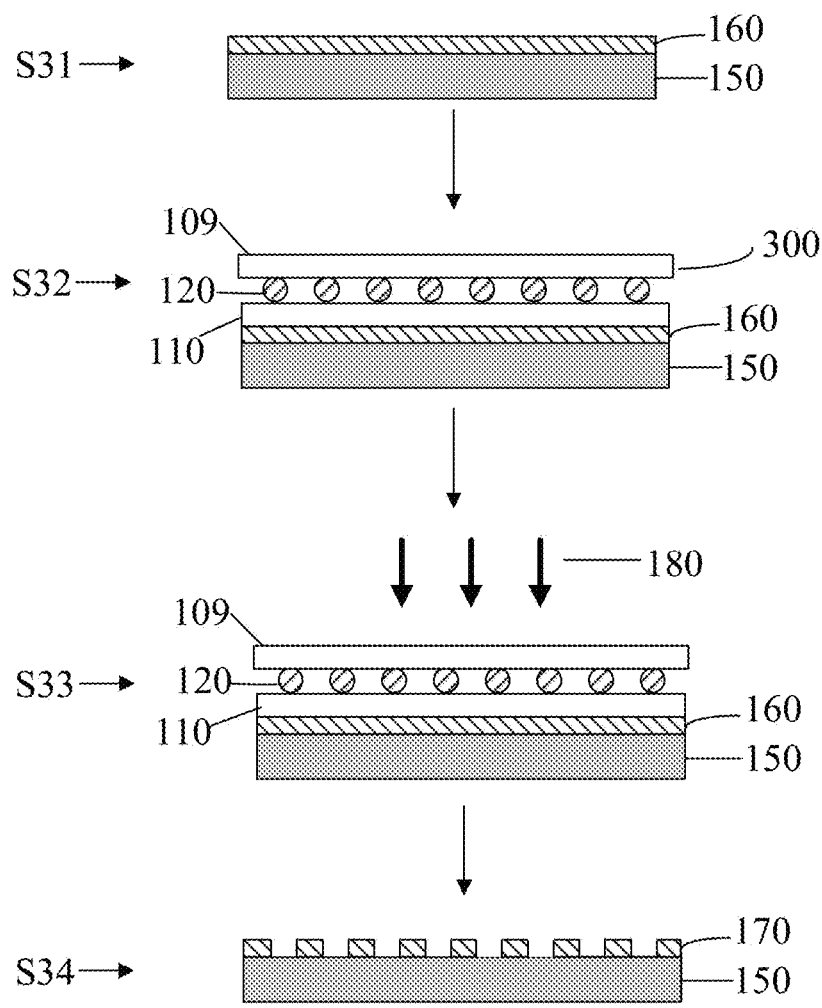
FIG. 11 is a flow chart of one exemplary embodiment of the method of making micro-nanostructure.

Referring to FIG. 11, an exemplary embodiment of a method of making microstructures comprises:

S31, providing a first substrate 150, setting a photoresist layer 160 on a surface of the first substrate 150;

S32, covering a surface of the photoresist layer 160 with a photolithography mask plate 300, wherein the photolithography mask plate 300 includes a second substrates 110, a third substrate 109, and a carbon nanotube layer 120 sandwiched between the two substrates;

S33, exposing the photoresist layer 160 by irradiating the photoresist layer 160 through the photolithography mask plate 300 with ultraviolet light 180, wherein the ultraviolet light 180 reach the photoresist layer 160 through the photolithography mask plate 300;

S34, removing the photolithography mask plate 300 from the photoresist layer 160 and developing the photoresist layer 160 to obtain a patterned photoresist microstructures 170.

The method of making microstructures is similar to the above method of making microstructures of FIG. 1 except that the photolithography mask plate 300 includes a second substrates 110, a third substrate 109, and a carbon nanotube layer 120 sandwiched between the two substrates. The use of the third substrate 109 is the same as that of the second substrate 110, and the material of the third substrate 109 can be the same as that of the second substrate 110. As the carbon nanotube layer 120 is sandwiched between the third substrate 109 and the second substrate 110, the third substrate 109 and the second substrate 110 can fix and grip the carbon nanotube layer 120. Due to the carbon nanotube layer 120 is fixed, it can not move on the plane and the direction perpendicular to the plane. The method for making the photolithography mask plate 300 is simple, and the photolithography mask plate 300 having a fixed carbon nanotube layer is obtained without the step of depositing a cover layer. In one exemplary embodiment, the carbon nanotube layer 120 is a pure carbon nanotube layer and only comprises a plurality of carbon nanotubes.

Figure 12:
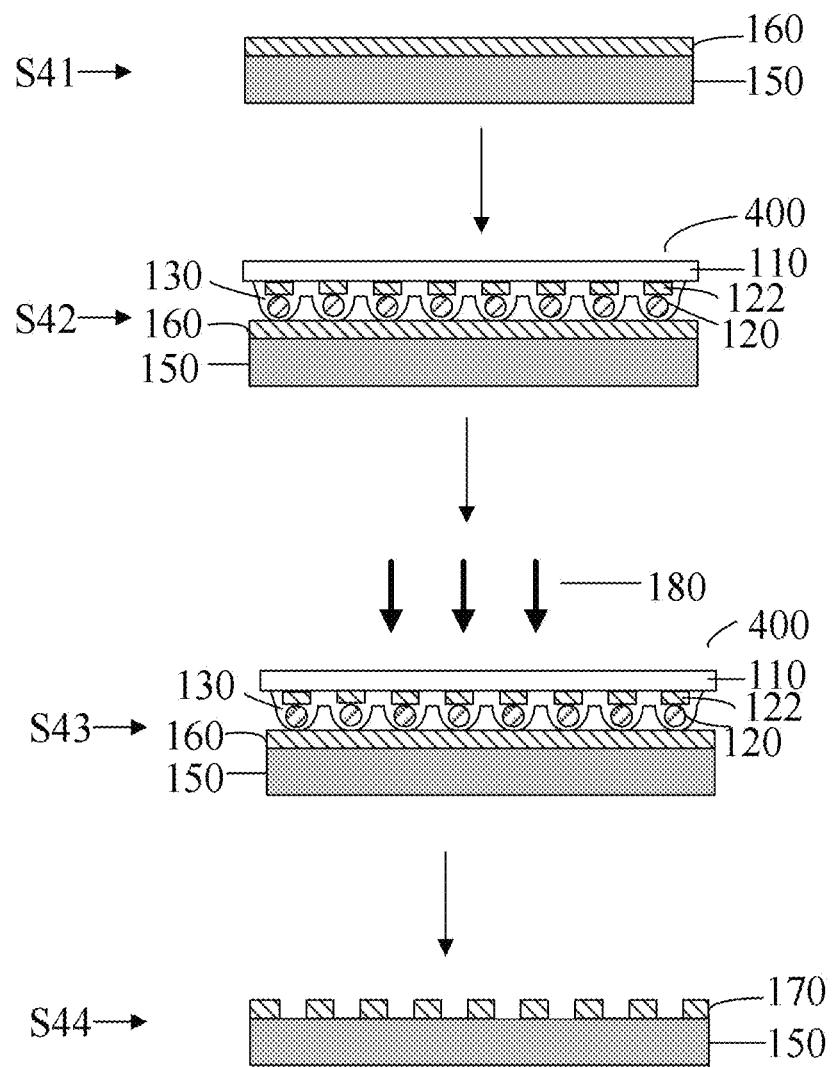
FIG. 12 is a flow chart of one exemplary embodiment of the method of making micro-nanostructure.

Referring to FIG. 12, an exemplary embodiment of a method of making microstructures comprises:

S41, providing a first substrate 150, setting a photoresist layer 160 on a surface of the first substrate 150;

S42, covering a surface of the photoresist layer 160 with a photolithography mask plate 400, wherein the photolithography mask plate 400 includes a second substrates 110, a first patterned chrome layer 122, a carbon nanotube layer 120, and a cover layer 130;

S43, exposing the photoresist layer 160 by irradiating the photoresist layer 160 through the photolithography mask plate 400 with ultraviolet light 180, wherein the ultraviolet light 180 reach the photoresist layer 160 through the photolithography mask plate 400;

S44, removing the photolithography mask plate 400 from the photoresist layer 160 and developing the photoresist layer 160 to obtain a patterned photoresist microstructures 170.

The method of making microstructures is similar to the above method of making microstructures of FIG. 1 except that the photolithography mask plate 400 includes a second substrates 110, a first patterned chrome layer 122, a carbon nanotube layer 120 and a cover layer 130. The pattern of the first patterned chrome layer 122 coincides with the pattern of the carbon nanotube layer 120. The photolithography mask plate 400 can be used as a photolithography mask unit, and a plurality of units are used in combination. Since the absorption rate of chromium to the ultraviolet light is high, the photolithography mask plate 400 has a better effect of absorbing ultraviolet light compared to a mask with only carbon nanotubes. The microstructures obtained by the photolithography mask plate 400 have higher accuracy compared to a mask with only carbon nanotubes.

Figure 13:
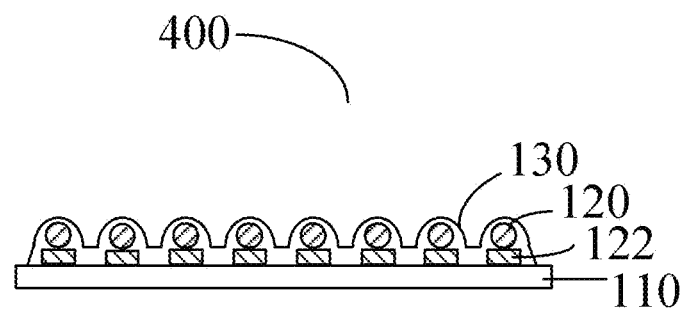
FIG. 13 is a structural schematic view of a photolithography mask plate used in the method of FIG. 11.

Referring to FIG. 13, the photolithography mask plate 400 above comprises: the second substrate 110, the first patterned chrome layer 122, the carbon nanotube layer 120, and the cover layer 130. The first patterned chrome layer 122 is located on the surface of the second substrate 110. The carbon nanotube layer 120 is located on a surface of the first patterned chrome layer 122 away from the second substrate 110. The pattern of the first patterned chrome layer 122 is the same with the pattern of the carbon nanotube layer 120. The cover layer 130 is located on the carbon nanotube layer 120 surface away from the second substrate 110. The cover layer 130 is continuously and directly attached to the carbon nanotube layer 120 surface.

Because the cover layer 130 can cover the entire carbon nanotube layer 120, the entire first patterned chrome layer 122, and a portion of the second substrate 110, the cover layer 130 can fix the carbon nanotube layer 120 on the second substrate 110.

The photolithography mask plate 400 is similar to the photolithography mask plate 100 except that the photolithography mask plate 400 includes the first patterned chrome layer 122 between the carbon nanotube layer 120 and the second substrate 110. The pattern of the first patterned chrome layer 122 coincides with the pattern of the carbon nanotube layer 120. Since the absorption rate of chromium to the ultraviolet light is high, the photolithography mask plate 400 has a better effect of absorbing ultraviolet light. The microstructures obtained by the photolithography mask plate 400 have higher accuracy.

Figure 14:
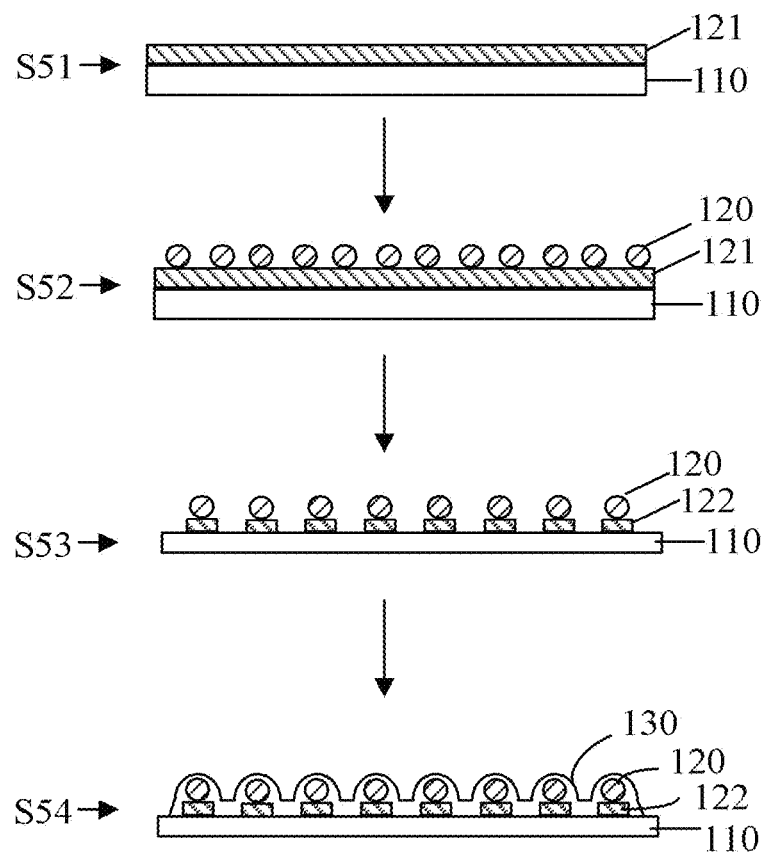
FIG. 14 is a flow chart of one exemplary embodiment of a method of making the lithographic mask of FIG. 13.

Referring to FIG. 14, an exemplary embodiment of a method of making the photolithography mask plate 400 comprises:

S51, providing a second substrate 110, setting a chrome layer 121 on a surface of the second substrate 110;

S52, locating a carbon nanotube layer 120 on a surface of the chrome layer 121 to expose a partial surface of the chrome layer 121;

S53, etching the chrome layer 121 with the carbon nanotube layer 120 as a mask to obtain a first patterned chrome layer 122;

S54, depositing a cover layer 130 on a surface of the carbon nanotube layer 120 away from the second substrate.

In step S51, the chrome layer 121 can be deposited by electron beam evaporation, ion beam sputtering, atomic layer deposition, magnetron sputtering, vapor deposition, chemical vapor deposition, etc. The chrome layer 121 is continuous and deposited on the second substrate 110. The thickness of the chrome layer 121 is from about 10 nm to about 50 nm. In one exemplary embodiment, the chrome layer 121 is deposited on the second substrate 110 by vapor deposition, and the thickness of the chrome layer 121 is 20 nm.

In step S52, the method of disposing the carbon nanotube layer 120 can be the same with the method above. The method can make the carbon nanotube layer 120 closely and firmly adhered on the chrome layer 121 surface. Partial surfaces of the chrome layer 121 corresponding to the holes of the carbon nanotube layer 120 are exposed.

In step S53, the etching method can be same with the method of etching the first substrate 150 above. The etching gases can be determined by the material which is etched. And the etching gases can not react with the carbon nanotube layer 120.

In step S54, the method of making the cover layer 130 is the same with the method above. The cover layer 130 is directly attached to the surface of the carbon nanotube layer 120 to form a continuous layer structure, and cover the first patterned chrome layer 122 at the same time. The carbon nanotube layer 120 is fixed on the second substrate 110 by the cover layer 130.

Figure 15:
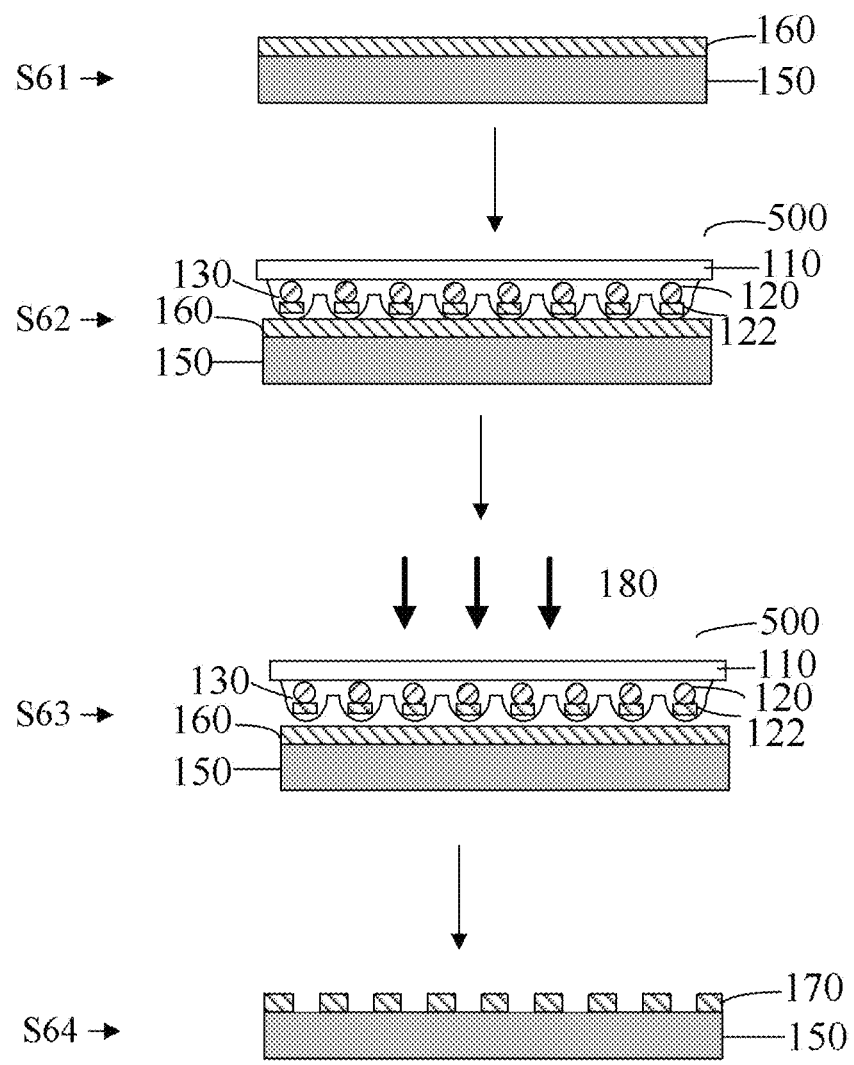
FIG. 15 is a flow chart of one exemplary embodiment of the method of making micro-nanostructure.

Referring to FIG. 15, an exemplary embodiment of a method of making microstructures comprises:

S61, providing a first substrate 150, setting a photoresist layer 160 on a surface of the first substrate 150;

S62, covering the surface of the photoresist layer 160 with a photolithography mask plate 500, wherein the photolithography mask plate 500 includes a second substrate 110, a first patterned chrome layer 122, a carbon nanotube layer 120, and a cover layer 130;

S63, exposing the photoresist layer 160 by irradiating the photoresist layer 160 through the photolithography mask plate 500 with ultraviolet light 180, wherein the ultraviolet light 180 reach the photoresist layer 160 through the photolithography mask plate 500;

S64, removing the photolithography mask plate 500 from the photoresist layer 160, and developing the photoresist layer 160 to obtain a patterned photoresist microstructures 170.

The method of making microstructures is similar to the method of making microstructures of FIG. 1 except that the first patterned chrome layer 122 is located between the carbon nanotube layer 120 and the cover layer 130. The pattern of the first patterned chrome layer 122 coincides with the pattern of the carbon nanotube layer 120. Since the absorption rate of chromium and carbon nanotube to the ultraviolet light is high, the microstructures obtained by the photolithography mask plate 500 have higher accuracy.

Figure 16:
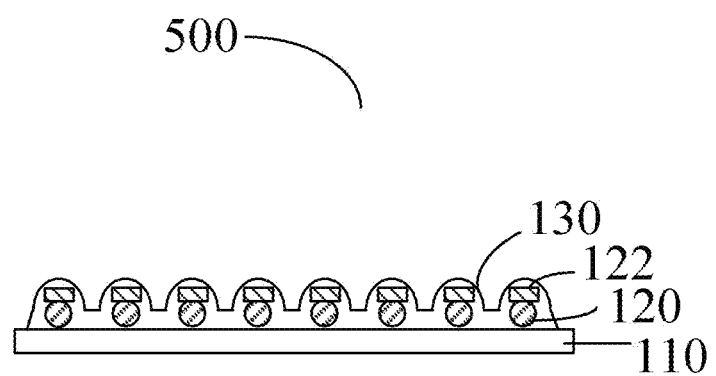
FIG. 16 is a structural schematic view of a photolithography mask plate used in the method of FIG. 15.

Referring to FIG. 16, the photolithography mask plate 500 above comprises: the second substrate 110, the carbon nanotube layer 120, the first patterned chrome layer 122, and the cover layer 130. The carbon nanotube layer 120 is located on the surface of the second substrate 110. The first patterned chrome layer 122 is located on the surface of the carbon nanotube layer 120 away from the second substrate 110. The pattern of the first patterned chrome layer 122 is the same with the pattern of the carbon nanotube layer 120. The cover layer 130 covers on the surface of the first patterned chrome layer 122 away from the second substrate 110.

The photolithography mask plate 500 is similar to the photolithography mask plate 400 except that the first patterned chrome layer 122 is located on the carbon nanotube layer 120 surface away from the second substrate 110. The pattern of the first patterned chrome layer 122 coincides with the pattern of the carbon nanotube layer 120. The microstructures obtained by the photolithography mask plate 500 have higher accuracy.

Figure 17:
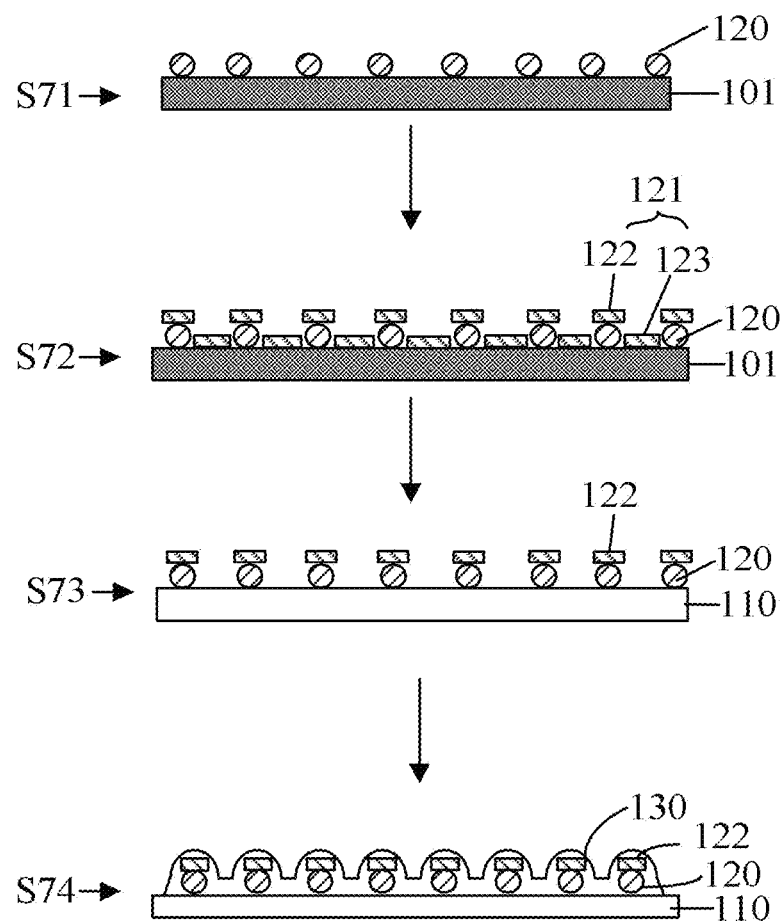
FIG. 17 is a flow chart of one exemplary embodiment of a method of making the lithographic mask of FIG. 16.

Referring to FIG. 17, an exemplary embodiment of a method of making the photolithography mask plate 500 comprises:

S71, providing a fourth substrate 101, setting a carbon nanotube layer 120 on the fourth substrate 101;

S72, locating a chrome layer 121 on the surface of the carbon nanotube layer 120 away from the fourth substrate 101, wherein the chrome layer 121 includes a first patterned chrome layer 122 and a second patterned chrome layer 123, the first patterned chrome layer 122 is located on the surface of carbon nanotubes of the carbon nanotube layer 120, and the second patterned chrome layer 123 is deposited on a surface of the fourth substrate 101 corresponding to holes of the carbon nanotube layer 120;

S73, transferring the carbon nanotube layer 120 with the first patterned chrome layer 122 thereon from the surface of the fourth substrate 101 to the surface of the second substrate 110, and the carbon nanotube layer 120 being in contact with the surface of the second substrate 110;

S74, depositing a cover layer 130 on the surface of the first patterned chrome layer 122 away from the second substrate 110.

In step S72, when the thickness of the chrome layer 121 is smaller than the thickness of the carbon nanotube layer 120, the chrome layer 121 is a discontinuous structure. The chrome layer 121 is divided into the first patterned chrome layer 122 and the second patterned chrome layer 123 away from each other. The first patterned chrome layer 122 is located only on the surface of the carbon nanotubes. The second patterned chrome layer 123 is located on partial surfaces of the fourth substrate 101, and the partial surfaces corresponds to and is exposed from the holes of the carbon nanotube layer 120.

In step S73, since the chrome layer 121 is a discontinuous layered structure, the carbon nanotube layer 120 can be directly detached from the fourth substrate 101 surface. After the first patterned chrome layer 122 and the carbon nanotube layer are transferred, the structure of the second patterned chrome layer 123 remains unchanged. The fourth substrate 101 and the second patterned chrome layer 123 can also be used as a photolithography mask.

Figure 18:
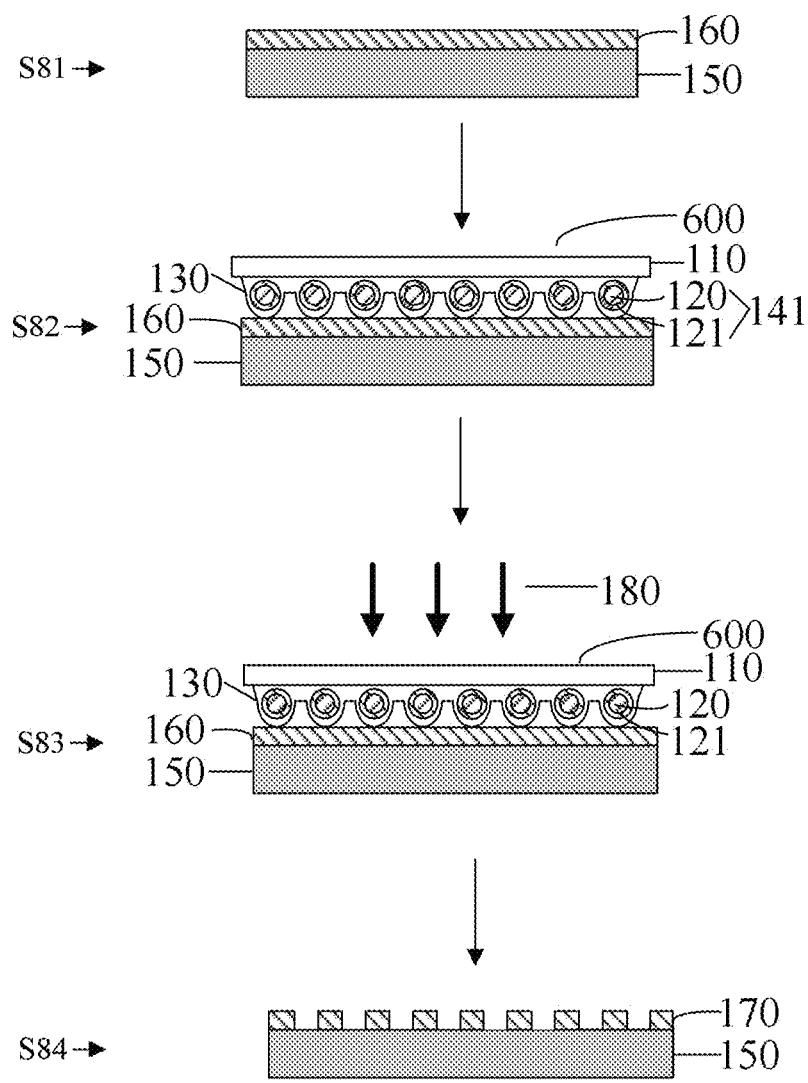
FIG. 18 is a flow chart of one exemplary embodiment of the method of making micro-nanostructure.

Referring to FIG. 18, an exemplary embodiment of a method of making microstructures comprises:
- S81, providing a first substrate 150, setting a photoresist layer 160 on a surface of the first substrate 150;
- S82, covering a surface of the photoresist layer 160 with a photolithography mask plate 600, wherein the photolithography mask plate 500 includes a second substrate 110, a carbon nanotube composite structure 141 and a cover layer 130;
- S83, exposing the photoresist layer 160 by irradiating the photoresist layer 160 through the photolithography mask plate 600 with ultraviolet light 180, wherein the ultraviolet light 180 reach the photoresist layer 160 through the photolithography mask plate 600;
- S84, removing the photolithography mask plate 600 from the photoresist layer 160, and developing the photoresist layer 160 to obtain a patterned photoresist microstructures 170.

The method of making microstructures is similar to the method of making microstructures of FIG. 1 except that the carbon nanotube composite structure 141 is located on the surface of the second substrate 110 and comprises a carbon nanotube layer 120, and a chrome layer 121 wraps the carbon nanotube layer 120. The chrome layer 121 completely covers each of carbon nanotubes in the carbon nanotube layer 120.

The advantages of the method of making microstructures includes the following points. Since the carbon nanotubes and chromium have the high absorption of ultraviolet light and the low transmittance to ultraviolet light, the transmittance to ultraviolet light of holes is very high, then it is easy to obtain patterned microstructures. The cover layer can fix the carbon nanotube layer on the second substrate to form a mask, and the mask is easy to disassemble and can be used repeatedly to cut costs. Also the mask can be produced in a large scale.

Figure 19:
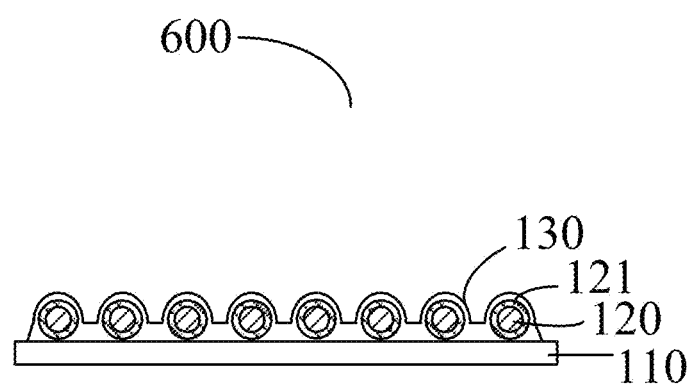
FIG. 19 is a structural schematic view of a photolithography mask plate used in the method of FIG. 18.

Referring to FIG. 19, the photolithography mask plate 600 above comprises: the second substrate 110, the carbon nanotube composite structure 141, and the cover layer 130. The carbon nanotube composite structure 141 is located on the surface of the second substrate 110. The carbon nanotube composite structure 141 comprises a carbon nanotube layer 120 and a chrome layer 121 wrapped the carbon nanotube layer 120. The cover layer 130 covers the surface of the carbon nanotube composite structure 141 away from the second substrate 110.

The photolithography mask plate 600 is similar to the photolithography mask plate 500 except that the chrome layer 121 is wrapped only on the surface of the carbon nanotubes in the carbon nanotube layer 120 and the holes between the carbon nanotubes are not covered by the chrome layer 121. The microstructures obtained by the photolithography mask plate 600 have a high precision.

Figure 20:
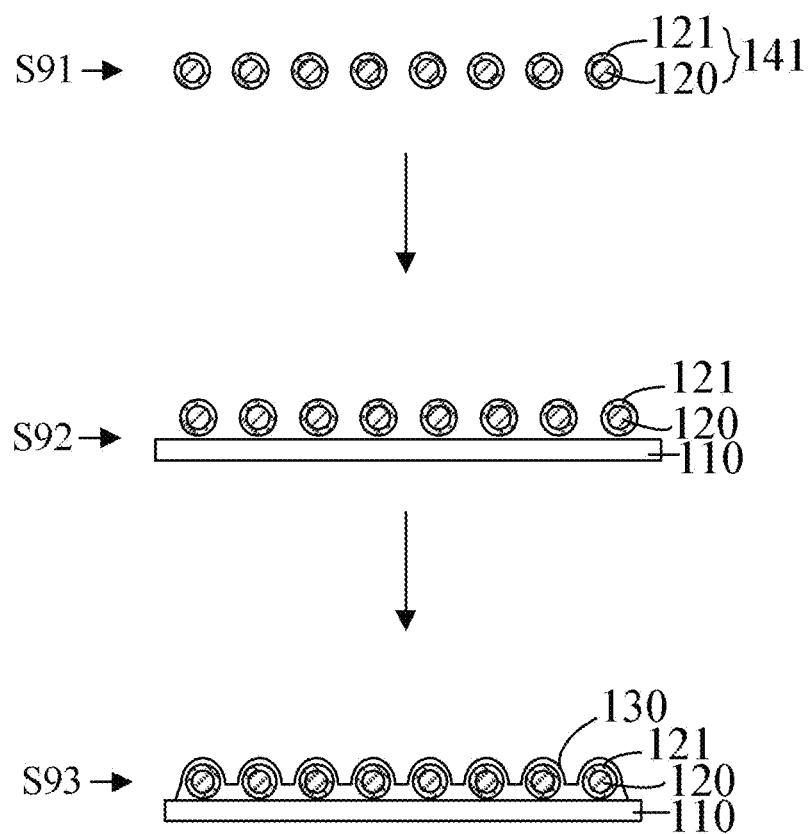
FIG. 20 is a flow chart of one exemplary embodiment of the method of making the lithographic mask of FIG. 19.

Referring to FIG. 20, an exemplary embodiment of a method of making the photolithography mask plate 600 comprises:
- S91, providing the carbon nanotube composite structure 141, wherein the carbon nanotube composite structure 141 comprises a carbon nanotube layer 120 and a chrome layer 121 wraps the carbon nanotube layer 120;
- S92, locating the carbon nanotube composite structure 141 on the surface of the second substrate 110 to expose partial surfaces of the second substrate 110;
- S93, depositing a cover layer 130 on the surface of the carbon nanotube composite structure 141 away from the second substrate 110.

The method of making the photolithography mask plate 600 is similar to the method of making the photolithography mask plate 500 except that the chrome layer 121 wraps the entire surface of the carbon nanotubes in the carbon nanotube layer 120. When the ultraviolet light passes through the photolithography mask plate 600, the ultraviolet light can pass through the chrome layer twice. The photolithography mask plate 600 has a higher absorption of UV light.

The exemplary embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure up to, and including, the full extent established by the broad general meaning of the terms used in the claims.

Depending on the exemplary embodiment, certain of the steps of methods described may be removed, others may be added, and the sequence of steps may be altered. The description and the claims drawn to a method may comprise some indication in reference to certain steps. However, the indication used is only to be viewed for identification purposes and not as a suggestion as to an order for the steps.

What is claimed is:

1. A photolithography mask plate, comprising:
   a substrate;
   a carbon nanotube composite structure on the substrate, wherein the carbon nanotube composite structure comprises a carbon nanotube layer and a chrome layer coated on the carbon nanotube layer; and
   a cover layer on the carbon nanotube composite structure, wherein the cover layer is a continuous layer and located on a surface of the carbon nanotube composite structure.

2. The photolithography mask plate as claimed in claim 1, wherein a transmittance of the substrate to ultraviolet light is higher than 60%.

3. The photolithography mask plate as claimed in claim 1, wherein the carbon nanotube layer is a free-standing structure and comprises a plurality of carbon nanotubes joined end to end by van der Waals attraction forces along a length direction of the plurality of carbon nanotubes.

4. The photolithography mask plate as claimed in claim 1, wherein the carbon nanotube layer comprises a carbon nanotube film, and the carbon nanotube film comprises a plurality of successive and oriented carbon nanotubes joined end-to-end by van der Waals attraction forces.

5. The photolithography mask plate as claimed in claim 4, wherein the carbon nanotube layer comprises at least two stacked carbon nanotube films, and an angle between aligned directions of carbon nanotubes in two adjacent carbon nanotube films is from 0 degrees to about 90 degrees.

6. The photolithography mask plate as claimed in claim 4, wherein the chrome layer wraps each of the plurality of successive and oriented carbon nanotubes.

7. The photolithography mask plate as claimed in claim 6, wherein the carbon nanotube composite structure defines a plurality of through holes.

8. The photolithography mask plate as claimed in claim 1, wherein the cover layer comprise a material selected from the group consisting of gold, nickel, titanium, iron, aluminum, chromium, alumina, magnesium oxide, zinc oxide, hafnium oxide, and metal sulfide.

9. The photolithography mask plate as claimed in claim 1, wherein the carbon nanotube composite structure is located between the substrate and the cover layer.

10. The photolithography mask plate as claimed in claim 1, wherein the cover layer is continuously and directly attached to the carbon nanotube composite structure surface.

11. The photolithography mask plate as claimed in claim 1, wherein the cover layer covers the entire carbon nanotube composite structure and the substrate.

12. The photolithography mask plate as claimed in claim 1, wherein the cover layer comprise a material selected from the group consisting of gold, nickel, titanium, iron, aluminum, alumina, magnesium oxide, zinc oxide, hafnium oxide, and metal sulfide.

13. The photolithography mask plate as claimed in claim 1, wherein the transmittance to UV light of the cover layer is more than 60%.

* * * * *